United States Patent [19]

Givens et al.

[11] Patent Number: 5,658,438
[45] Date of Patent: Aug. 19, 1997

[54] SPUTTER DEPOSITION METHOD FOR IMPROVED BOTTOM AND SIDE WALL COVERAGE OF HIGH ASPECT RATIO FEATURES

[75] Inventors: John H. Givens, Boise; Richard L. Elliott, Meridian, both of Id.

[73] Assignee: Micron Technology, Inc., Boise, Id.

[21] Appl. No.: 574,958

[22] Filed: Dec. 19, 1995

[51] Int. Cl.$^6$ ................................................. C23C 14/34
[52] U.S. Cl. ............................ 204/192.11; 204/192.12; 204/192.17; 204/298.11; 204/298.26
[58] Field of Search ..................... 204/192.11, 192.12, 204/192.17, 298.04, 298.06, 298.09, 298.11, 298.16, 298.23, 298.26, 298.28

[56] References Cited

U.S. PATENT DOCUMENTS

| | | | |
|---|---|---|---|
| 3,616,401 | 10/1971 | Cunningham et al. | 204/192.25 |
| 5,171,412 | 12/1992 | Talieh et al. | 204/192.15 |

FOREIGN PATENT DOCUMENTS

| | | | |
|---|---|---|---|
| 5-263222 | 10/1993 | Japan | 204/298.11 |
| 5-311419 | 11/1993 | Japan | 204/298.11 |
| 5-326426 | 12/1993 | Japan | 204/298.11 |
| 6-136527 | 5/1994 | Japan | 204/298.11 |
| 6-264229 | 9/1994 | Japan | 204/298.11 |

*Primary Examiner*—Aaron Weisstuch
*Attorney, Agent, or Firm*—Workman, Nydegger and Seeley

[57] ABSTRACT

A method of sputter deposition for improved side wall and bottom coverage of high aspect ratio features on a substrate includes alternatingly exposing the substrate having high aspect ratio features to a collimated sputtered particle flux and a less-collimated sputtered particle flux until a desired deposition thickness is reached. A confining magnetic field may be used to reduce electron losses at process chamber walls, allowing for improved collimation of the collimated flux. The substrate may also be heated or biased during exposure to the less-collimated flux to increase the good side wall and step coverage of the less-collimated flux, and cooled or reverse-biased during exposure to the collimated flux to increase the good bottom coverage of the collimated flux. Alternatively, the substrate may be exposed to only a collimated flux, but good sidewall coverage by be achieved by alternating the temperature and/or bias of the substrate to provide the desired side wall and step coverage.

24 Claims, 2 Drawing Sheets

SPUTTER DEPOSITION METHOD FOR IMPROVED BOTTOM AND SIDE WALL COVERAGE OF HIGH ASPECT RATIO FEATURES

BACKGROUND OF THE INVENTION

1. The Field of the Invention

The present invention relates to the manufacture of semiconductor devices. More particularly, the present invention is directed to methods and apparatuses for providing improved bottom and sidewall coverage of high aspect ratio features during sputter deposition in the manufacture of a semiconductor device.

2. The Relevant Technology

The ever increasing circuit density of state of the art semiconductor devices has resulted in increasing aspect ratios for various structures formed during the manufacture of integrated circuits. Particularly for such structures as contacts and vias, higher aspect ratios have had a negative effect on fabrication yields. Adequate bottom coverage of high aspect ratio contacts and vias has been somewhat difficult to achieve. To provide a deposition system capable of depositing a film with adequate bottom coverage of high aspect ratio features, collimated sputtering is typically employed. But when deposition is performed in a collimated sputtering system with sufficient collimation to provide adequate bottom coverage of high aspect ratio features, then the sidewalls of high aspect ratio features can be left without adequate coverage. Decreasing the collimation, by, for example, decreasing the collimator aspect ratio, can result in pinching off of the high aspect ratio space before adequate bottom coverage can occur. Thus a method of providing adequate coverage both of side walls and of bottom surfaces of high aspect ratio features is needed.

SUMMARY AND OBJECTS OF THE INVENTION

An object of the present invention is to provide methods and apparatuses for affording improved bottom and side wall coverage during sputter deposition of high aspect ratio features in a semiconductor device.

Another object of the present invention is to provide methods and apparatuses for affording improved bottom and side wall coverage during sputter deposition of high aspect ratio features in a semiconductor device, which methods and apparatuses are easily adaptable to typical sputtering devices.

Yet another object of the present invention is to provide improved process yield in the process of forming high aspect ratio structures in the manufacture of semiconductor devices.

In accordance with the present invention, side wall and bottom coverage of high aspect ratio features during sputter deposition is improved by alternatingly exposing a substrate having high aspect ratio features to a collimated sputtered particle flux and a less-collimated sputtered particle flux until a desired deposition thickness is reached. The collimated flux provides good bottom coverage and the less-collimated flux provides good sidewall and step coverage, and the alternation between the two fluxes prevents either one from creating sufficient buildup to block adequate sidewall or bottom coverage.

A confining magnetic field may be used to reduce electron losses at process chamber walls, allowing for improved collimation of the collimated flux.

The substrate may also be heated or biased during exposure to the less-collimated flux to increase the good side wall and step coverage of the less-collimated flux, and cooled or reverse-biased during exposure to the collimated flux to increase the good bottom coverage of the collimated flux. Alternatively, the substrate may be exposed to only a collimated flux, but good sidewall coverage may be achieved by alternating the temperature and/or bias of the substrate to provide the desired side wall coverage.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention includes apparatuses and methods for improving bottom coverage and side wall coverage during the sputter deposition of high aspect ratio features of a semiconductor device. The basic steps of a method of the present invention are outlined in the flow diagram in FIG. 1.

Figure 1:
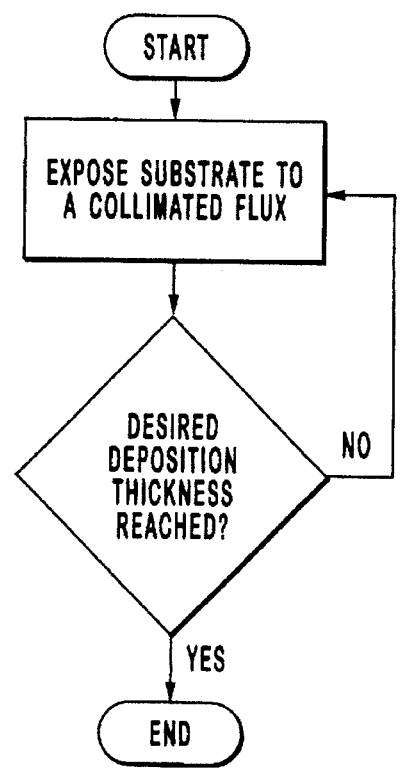
FIG. 1 is a flow chart of a method according to the present invention.

At the start of the flow diagram of FIG. 1, a substrate is provided having thereon high aspect ratio spaces to be filled. The high aspect ratio spaces are the spaces in which high aspect ratio structures such as contact plugs or vias are to be formed.

As seen in the flow diagram of FIG. 1, the substrate is first exposed to a collimated flux of sputtered particles, resulting in deposition and fill characteristics typical of collimated sputtering. The substrate is exposed only long enough to gain the benefits of collimated sputtering, including good bottom coverage, but not long enough to cause gaps in the side wall coverage. The substrate is next exposed to a less-collimated flux of sputtered particles, resulting in deposition and fill characteristics typical of less-collimated or uncollimated sputtering, including good side wall and step coverage, but the substrate is not exposed long enough to result in pinching off over the top of high aspect ratio spaces. The above two steps are then repeated until the desired deposition thickness is reached. The two steps are performed as part of a single process step in the manufacture of the semiconductor device.

The above method provides a sputter deposition process that simultaneously provides both good bottom coverage and good side wall coverage of high aspect ratio features. The collimated flux covers the bottom surfaces of the high aspect ratio features, while the less-collimated flux assists in covering the side walls of the high aspect ratio features. The substrate is continuously exposed to either flux type for only a short time relative to the total deposition time. Thus one flux type has insufficient time to build up and close off access to those surfaces which are preferentially deposited by the other flux type, and all surfaces receive optimal coverage.

The above method may be carried out in any number of ways. A substrate in the form of a wafer may be held in place while collimated and less-collimated fluxes are alternately directed at the substrate. The collimated and less-collimated fluxes may for example be from the same target with a removable collimator providing the adjustment to the degree of collimation. The collimated and less-collimated fluxes may originate from different targets. The sputtering agent and power source may likewise be the same or different for the collimated and less-collimated fluxes. The substrate may also be rotated or otherwise moved out from one flux and into the other. Presently preferred ways and presently preferred equipment for performing the above method are explained below with reference to FIGS. 2–4.

Figure 2:
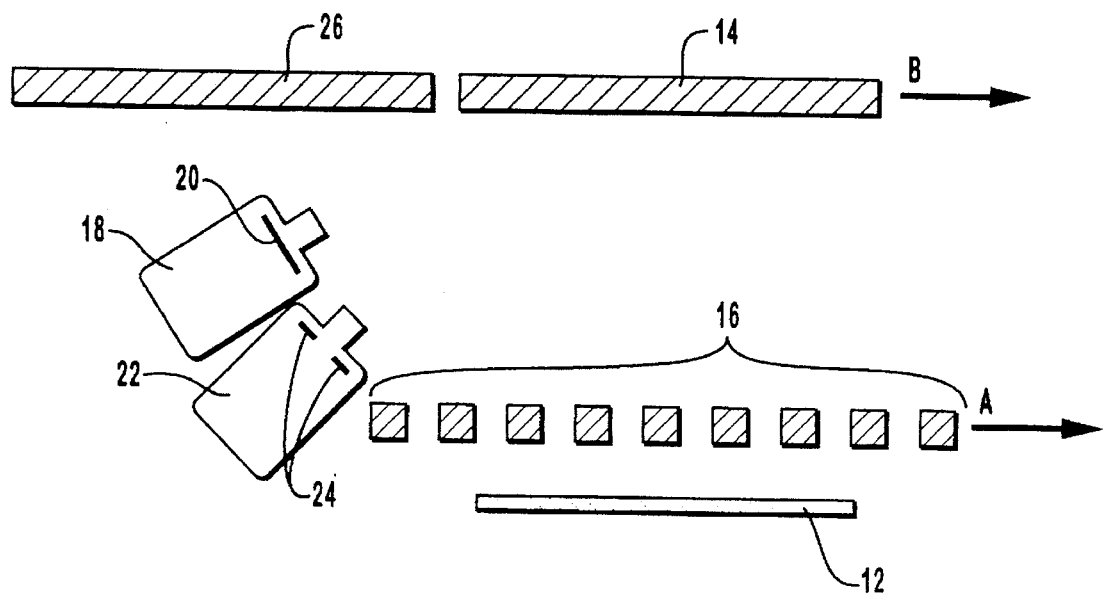
FIG. 2 is a schematic cross section of a portion of a collimated sputtering apparatus of the present invention for use in practicing the methods of the present invention.

FIG. 2 is a schematic cross section of a portion of a collimated sputtering apparatus. The apparatus of FIG. 2 is designed to allow a substrate 12 to remain stationary while a collimated and a less-collimated flux are alternately directed toward the surface of substrate 12 by any of various means.

Substrate 12 is positioned opposite a target 14. A collimator 16 is positioned between substrate 12 and target 14, and may be removable in a direction A to provide less-collimated flux. Target 14 may be sputtered in a plasma, or by an ion gun 22. Multiple ion guns 22, 18 may also be employed, and the ion species and the angle of approach to target 14 may be individually selected for each gun so as to provide a collimated flux and a less-collimated flux according to the gun in use. Shutters 20, 24 may be employed to switch from one gun to the next.

An additional or second target 26 may also be employed in addition to target 14, in which case target 14 may be removable by motion in direction B and replaceable by target 26 during deposition. Target 14 may be formed having a crystal structure and orientation favoring a collimated sputtered flux, while target 26 may have an amorphous structure or other structure resulting in a less-collimated flux. Instead of being moveable, targets 14 and 26 may also be placed behind shutters. Any of the above features may be employed alone or in concert with others to alternatingly produce a collimated and a less-collimated particle flux at the surface of wafer 12.

Figure 3:
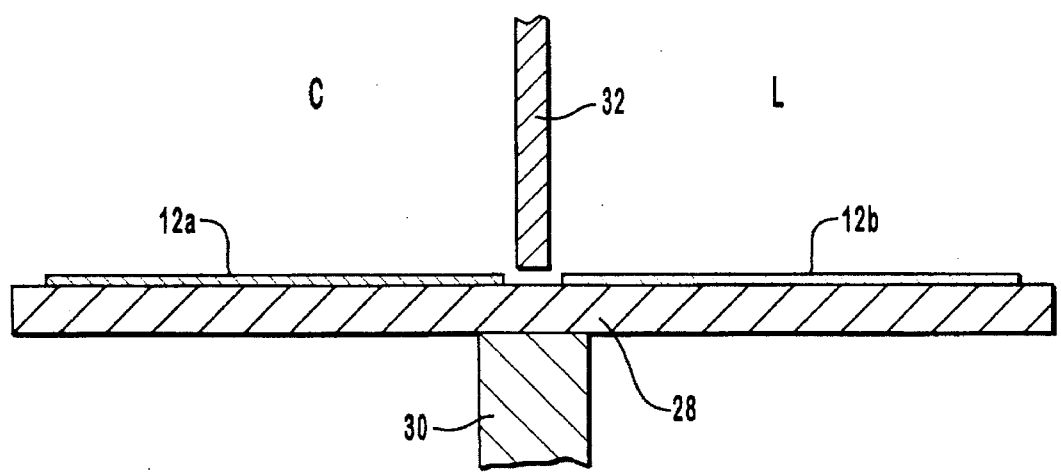
FIG. 3 is a schematic cross section of a portion of a collimated sputtering apparatus of the present invention with multiple moving substrates for use in practicing the methods of the present invention.

As an alternative to equipment intended for use with a stationary substrate, such as the equipment illustrated schematically in FIG. 2, a substrate or even multiple substrates, such as substrates 12a and 12b shown in FIG. 3, may be moved, such as by rotation, back and forth from an area of collimated flux to an area of less-collimated flux. As an example, substrates 12a and 12b of FIG. 3 may be supported on a platen 28. Platen 28 may rotate on a spindle 30 such that substrates 12a and 12b are alternately in an area C of collimated flux and an area L of less-collimated flux. Areas C and L may optionally be separated by a partition 32. The collimated flux in area C and the less collimated flux in area L may be produced by any acceptable means including for example any of the means for producing more or less collimation described herein.

In addition to other techniques, the pressure at which the sputter deposition is performed may be varied. Higher pressures are associated with a shorter mean free path for sputtered particles, resulting in more scattering and less collimation. Hence pressure variation may be used to assist in providing a collimated and a less-collimated flux. For example, a less-collimated flux may be produced at a relatively high pressure range of about 2 mTorr to 10 mTorr, while a more collimated flux may be produced at a range of about 0.1 mTorr to 2 mTorr.

Figure 4:
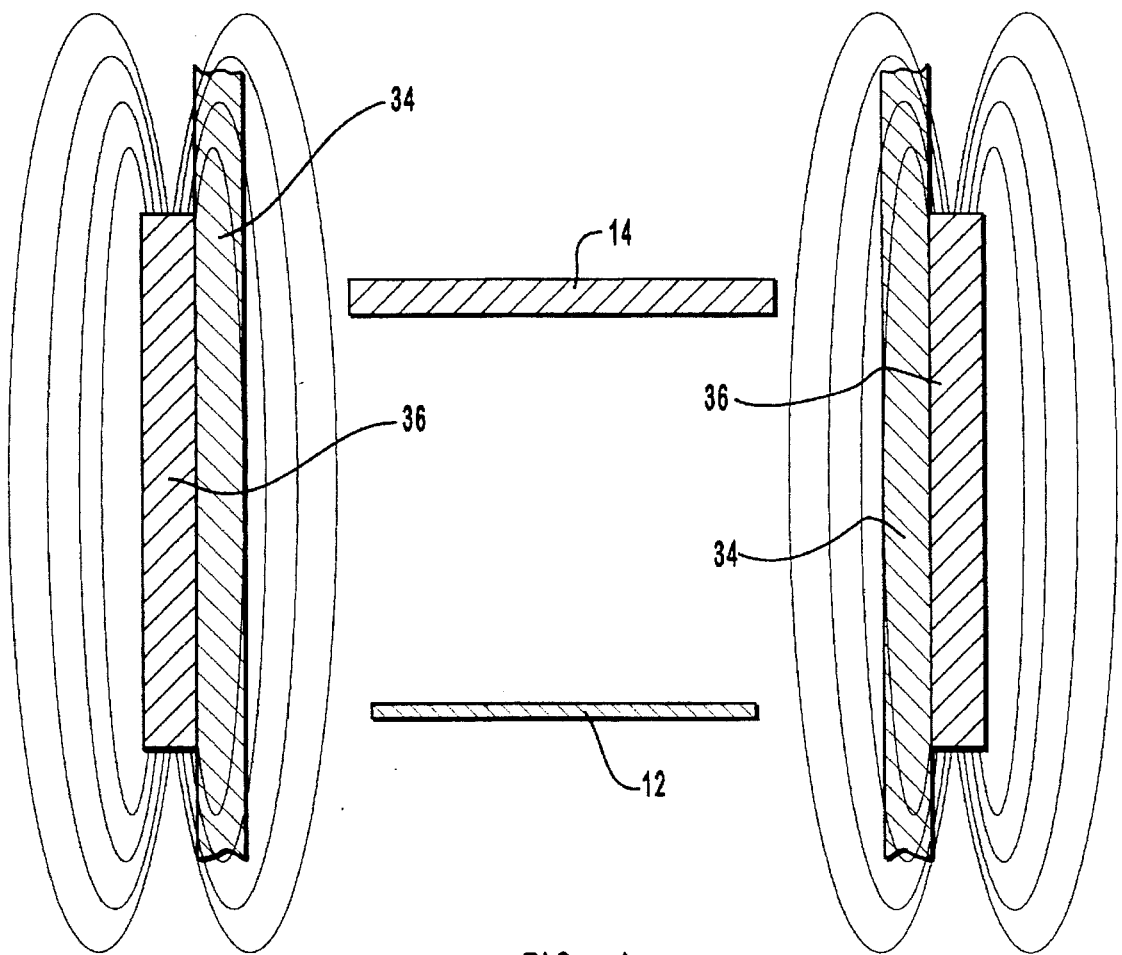
FIG. 4 is a schematic cross section of a portion of a collimated sputtering apparatus of the present invention having magnetic fields for use in practicing the methods of the present invention.

A confining magnetic field may also be used to assist in increasing the degree of collimation achieved. As illustrated in FIG. 4, permanent or coil magnets 36 may be located near the exterior of sputtering chamber walls 34, resulting in magnetic field lines located inside chamber walls 34 and running parallel thereto, with the density of the field lines increasing near the surface of chamber walls 34. The magnetic field should preferably extend from near target 14 to near substrate 12 as shown. Such a magnetic field repels electrons approaching chamber walls 36 so that less electrons are lost by conduction through chamber walls 36 With less electron loss, the plasma can be sustained at a lower pressure, allowing a greater mean free path for sputtered particles with a resulting decrease in scattering and increase in collimation. The magnetic field itself, if generated by coil magnets, may also be turned off to assist in providing a less-collimated flux.

The method illustrated in FIG. 1 may also be supplemented by techniques for altering the deposition characteristics other than varying the degree of collimation. Such techniques presently preferred include varying the temperature of the substrate and varying the bias of the substrate. Higher substrate temperatures may be used to increase the migration of adatoms deposited during either collimated or less-collimated deposition, but preferably only during less-collimated deposition. A substrate bias may be provided to produce a desired degree of re-sputtering of the deposited film, preferably during less-collimated deposition. Higher substrate temperature and substrate bias may even be used individually or together with a collimated particle flux to achieve side wall coverage such that alternation of the flux type is not required, only alternation of the substrate temperature and bias. Low substrate temperature and a reverse bias on the substrate may also be used during collimated deposition to improve bottom coverage by reducing adatom migration and resputtering of the deposited film. As examples, substrate temperatures in the range of about 150° to 700° C. may be used to increase adatom migration, while substrate temperatures in the range of about −15° to 150° C. may be used to decrease such migration. Substrate bias voltage in the range of about −31 to −500 V may be used to provide a beneficial level of resputtering of the deposited film, while a bias voltage in the range of about +31 to 100 V (low, zero, or reverse bias) may be used to inhibit resputtering.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for improved sputter deposition of structures in a semiconductor device comprising:

providing a substrate having thereon spaces to be filled; and exposing said substrate alternately to a collimated sputtered particle flux and a less-collimated sputtered particle flux by alternately exposing said substrate to:

a first sputtered particle flux from a target having a crystal structure preferentially oriented to maximize collimation of said first sputtered particle flux, and a second sputtered particle flux from a target having a crystal structure not preferentially oriented to maximize collimation of said second sputtered particle flux;

whereby said spaces are filled with good bottom and sidewall coverage.

2. The method as defined in claim 1, wherein said substrate remains stationary.

3. The method as defined in claim 1 wherein said substrate is moved from a first position at which said substrate is exposed to said first sputtered particle flux to a second position at which said substrate is exposed to said second sputtered particle flux.

4. The method as defined in claim 1, further comprising providing a confining magnetic field extending from a target to the substrate to confine electrons, whereby the pressure required for sputtering to occur is decreased.

5. A method for improved sputter deposition of structures in a semiconductor device comprising:

providing a substrate having thereon spaces to be filled;

providing a first target to be sputtered;

providing a sputtering chamber having chamber walls;

positioning said first target and said substrate in said chamber;

striking a plasma in said chamber while confining electrons associated with said plasma in a magnetic field extending from near said first target to near said substrate, said magnetic field oriented to repel electrons approaching said chamber walls;

maintaining said plasma at a pressure in a range of about 0.1 mTorr to 2 mTorr;

sputtering said first target in said plasma and allowing sputtered particles of said first target to deposit on said substrate;

positioning a second target in said chamber; and sputtering said second target in said plasma and allowing sputtered particles of said second target to deposit on said substrate, wherein said substrate is exposed to sputtered particles of said first target and sputtered particles of said second target in alternation, and wherein said first target has a crystal structure which enhances the collimation of sputtered particles of said first target relative to the collimation of the sputtered particles of said second target;

whereby said low pressure reduces scattering of said sputtered particles, resulting in improved film deposition in said spaces.

6. The method as defined in claim 5, further comprising:

providing a collimator; and positioning said collimator in said chamber such that any sputtered particles of said first target must pass through said collimator before reaching said substrate.

7. The method as defined in claim 6, further comprising moving said collimator to a new position in said chamber such that sputtered particles of said first target need not pass through said collimator before reaching said substrate.

8. The method as defined in claim 5, further comprising providing a confining magnetic field extending from a target to the substrate to confine electrons, whereby the pressure required for sputtering to occur is decreased.

9. A method for improved sputter deposition of structures in a semiconductor device comprising:

providing a substrate having thereon spaces to be filled;

exposing said substrate to a collimated sputtered particle flux; and alternating a bias voltage at said substrate between a low and a high value, said low value being within the range of about −30 to 100 V, and said high value being within the range of about −30 to −500 V, whereby said spaces are filled with good bottom and sidewall coverage.

10. The method as defined in claim 9, further comprising alternating the temperature of said substrate between a low and a high value, said low value being within the range of about −15° to 150° C., and said high value being within the range of about 150° to 700° C.

11. The method as defined in claim 9, wherein said substrate remains stationary and a collimator is moved from a position in said chamber at which a given sputtered particle flux must pass through said collimator before reaching said substrate to a position at which said given sputtered particle flux need not pass through said collimator before reaching said substrate.

12. A method for improved splitter deposition of structures in a semiconductor device, said method comprising:

providing a substrate having thereon spaces to be filled;

exposing said substrate alternately to a collimated sputtered particle flux and a less-collimated sputtered particle flux by alternately exposing said substrate to:

a sputtered particle flux that passes through a collimator on its way to said substrate, and a sputtered particle flux that does not pass through a collimator on its way to said substrate;

said substrate being moved from a first position at which said substrate is exposed to a sputtered particle flux that passes through a collimator on its way to said substrate, and said substrate being moved to a second position at which said substrate is exposed to a sputtered particle flux that does not pass through a collimator on its way to said substrate;

whereby said spaces are filled with good bottom and sidewall coverage.

13. The method as defined in claim 12, further comprising providing a confining magnetic field extending from a target to the substrate to confine electrons, whereby the pressure required for sputtering to occur is decreased.

14. A method for improved sputter deposition of structures in a semiconductor device, said method comprising:

providing a substrate having thereon spaces to be filled; and exposing said substrate alternately to a collimated sputtered particle flux and a less-collimated sputtered particle flux by alternately exposing said substrate to:

a sputtered particle flux at a pressure in the range of about 2 to 10 mTorr; and a sputtered particle flux at a pressure in the range of about 0.1 to 2 mTorr;

whereby said spaces are filled with good bottom and sidewall coverage.

15. The method as defined in claim 14, further comprising providing a confining magnetic field extending from a target to the substrate to confine electrons, whereby the pressure required for sputtering to occur is decreased.

16. A method for improved sputter deposition of structures in a semiconductor device, said method comprising:

providing a substrate having thereon spaces to be filled; and exposing said substrate alternately to a collimated sputtered particle flux and a less-collimated sputtered particle flux, by alternately exposing said substrate to:

a first sputtered particle flux sputtered by ions from an ion gun configured and oriented to enhance the collimation of said first sputtered particle flux, and it second sputtered particle flux sputtered by ions from an ion gun configured and oriented to produce said second sputtered particle flux with less collimation than said first sputtered particle flux;

whereby said spaces are filled with good bottom and sidewall coverage.

17. The method as defined in claim 16, further comprising providing a confining magnetic field extending from a target to the substrate to confine electrons, whereby the pressure required for sputtering to occur is decreased.

18. A method for improved sputter deposition of structures in a semiconductor device, said method comprising:

providing a substrate having thereon spaces to be filled;

exposing said substrate alternately to a collimated sputtered particle flux and a less-collimated sputtered particle flux; and alternately providing a high temperature and a low temperature at said substrate;

whereby said spaces are filled with good bottom and sidewall coverage.

19. The method as defined in claim 18 wherein said high temperature is within the range of about 150° to 700° C., and said low temperature is within the range of about −15° to 150° C.

20. The method as defined in claim 18, wherein said high temperature is provided at said substrate while said substrate is exposed to said less-collimated sputtered particle flux, and said low temperature is provided at said substrate while said substrate is exposed to said collimated sputtered particle flux.

21. The method as defined in claim 18, further comprising providing a confining magnetic field extending from a target to the substrate to confine electrons, whereby the pressure required for sputtering to occur is decreased.

22. A method for improved sputter deposition of structures in a semiconductor device, said method comprising:

providing a substrate having thereon spaces to be filled;

exposing said substrate alternately to a collimated sputtered particle flux and a less-collimated sputtered particle flux; and providing a voltage bias at said substrate;

whereby said spaces are filled with good bottom and sidewall coverage.

23. The method as defined in claim 22, wherein providing said voltage bias at said substrate comprises varying the voltage bias at said substrate between a high bias and a low bias, said high bias being in the range of about −30 to −500 V, and said low bias being in the range of about −30 to 100 V.

24. The method as defined in claim 22, further comprising providing a confining magnetic field extending from a target to the substrate to confine electrons, whereby the pressure required for sputtering to occur is decreased.

* * * * *

UNITED STATES PATENT AND TRADEMARK OFFICE
CERTIFICATE OF CORRECTION

PATENT NO. : 5,658,438

DATED : Aug. 19, 1998

INVENTOR(S) : John H. Givens; Richard L. Elliott

It is certified that error appears in the above-identified patent and that said Letters Patent is hereby corrected as shown below:

Cover Page, Abstract, line 26, after "coverage" change "by" to --may--

Col. 4, line 25, after "36" insert a period

Col. 4, line 30, after "be" change "mined" to --turned--

Col. 4, line 41, after "of" change "re-sputtering" to --resputtering--

Col. 4, line 55, after "about" change "31" to --30--

Col. 4, line 58, after "about" change "+31" to ---30--

Col. 7, line 16, before "second" change "it" to --a--

Signed and Sealed this

Tenth Day of November 1998

Attest:

BRUCE LEHMAN

*Attesting Officer*    *Commissioner of Patents and Trademarks*